(12) United States Patent
Ho

(10) Patent No.: US 6,747,905 B1
(45) Date of Patent: Jun. 8, 2004

(54) VOLTAGE RECOVERY SWITCH

(75) Inventor: Chien-Hung Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/249,887

(22) Filed: May 15, 2003

(51) Int. Cl.[7] .................................. G11C 7/00
(52) U.S. Cl. .......................... 365/189.11; 365/189.09; 365/185.18
(58) Field of Search .................. 365/189.11, 189.09, 365/185.18, 185.23, 185.01

(56) References Cited

U.S. PATENT DOCUMENTS

| | | | | |
|---|---|---|---|---|
| 4,694,430 A | * | 9/1987 | Rosier | 365/185.23 |
| 4,835,423 A | * | 5/1989 | de Ferron et al. | 327/436 |
| 4,875,188 A | * | 10/1989 | Jungroth | 365/185.22 |
| 6,366,505 B1 | * | 4/2002 | Fournel | 365/189.09 |
| 6,477,091 B2 | * | 11/2002 | Tedrow et al. | 365/189.11 |

* cited by examiner

*Primary Examiner*—Anh Phung
(74) *Attorney, Agent, or Firm*—Winston Hsu

(57) ABSTRACT

A voltage recovery switch for neutralizing a first voltage and a second voltage in a non-volatile memory. The voltage recovery switch includes a first PMOS transistor having a gate electrically connected to a third voltage and a source electrically connected to the first voltage, an NMOS transistor having a gate electrically connected to a control signal and a drain electrically connected to a drain of the first PMOS transistor, and a second PMOS transistor having a gate electrically connected to a fourth voltage, a source electrically connected to the source of the NMOS transistor, and a drain electrically connected to the second voltage.

18 Claims, 3 Drawing Sheets

VOLTAGE RECOVERY SWITCH

BACKGROUND OF INVENTION

1. Field of the Invention

The present invention relates to a voltage recovery switch, and more specifically, to a voltage recovery switch without device breakdown issue in non-volatile memory.

2. Description of the Prior Art

Memory is one of the most important components in electronic products and is categorized into two types: volatile memory and non-volatile memory. Since data stored in non-volatile memory can remain in the memory cells even the power supply connected to the non-volatile memory is shut down, non-volatile memory, such as flash memory, is more frequently used in various electronic products than volatile memory is.

According to the prior art, a non-volatile memory cell is formed on a substrate and comprises a source, a drain, and a stacked gate. Normally, the stacked gate comprises floating gate and a control gate, and a silicon oxide layer is positioned between either the floating gate and the substrate or the control gate and the floating gate to isolate either two of the substrate, the floating gate, and the control gate. The stacked gate technique used in non-volatile memory applies a high potential voltage to the control gate to change stored electron amounts in the floating gate by either electron FN tunneling effects or hot electron injection, which eventually changes the threshold voltage of the select gate and records data.

Generally, the non-volatile memory comprises a charge pump for generating the high potential voltages previously mentioned, such as a positive voltage of 10V and a negative voltage of 10V, for the purpose of programming or erasing of the non-volatile memory. After programming or erasing of the non-volatile memory, the non-volatile memory works at a power supply voltage level, normally between an operating voltage $V_{dd}$ of +3V and a grounded voltage of 0V. Simultaneously, the charge pump is turned off, and the high potential voltages are discharged by the power supply voltage. However, a bounce phenomenon of the voltage level of the power supply voltage frequently occurs when the huge amount of charges are directly conducted from the high potential voltages to the power supply voltage, such as electrically connecting a positive voltage of +10V and a negative voltage of 10V respectively to the operating voltage $V_{dd}$ and the grounded voltage, leading to noise and malfunction of the voltage recovery switch.

In order to prevent the bounce phenomenon previously mentioned, a voltage recovery switch is frequently employed in the non-volatile memory according to the prior art to electrically connect the high potential voltages to neutralize positive and negative charges in the high potential voltages until the high potential voltages are mildly decreased to a lower voltage level. The high potential voltages are then electrically connected to the power supply voltage for further discharge. Since most portions of the positive and negative charges in the high potential voltages are neutralized by the voltage recovery switch, the bounce phenomenon during the discharge of the high potential voltages by the power supply voltage is limited to be within an acceptable range.

Please refer to FIG. 1 showing a schematic view of a voltage recovery switch 10 according to the prior art. As shown in FIG. 1, the voltage recovery switch 10 comprises a first NMOS transistor 12, a PMOS transistor 14, and a second NMOS transistor 16. A drain and a gate of the first NMOS transistor 12 are electrically connected to the positive voltage of +10V and a first control signal CTRL1, respectively, and a source and a gate of the PMOS transistor 14 are electrically connected to a source of the first NMOS transistor 12 and a voltage with a constant voltage level, such as the grounded voltage, respectively. A drain, a gate, and a source of the second NMOS transistor 16 are electrically connected to a drain of the PMOS transistor 14, a second control signal CTRL2, and the negative voltage of 10V, respectively. The structure of the voltage recovery switch 10 is revealed in JSSC 2000 November, "A Channel-Erasing 1.8V-Only 32 Mb NOR Flash EEPROM with a Bitline Direct Sensing Scheme" and is abbreviated for simplicity of description.

The first and second control signals CTRL1 and CTRL2 are employed to respectively turn off the first and second NMOS transistors 12 and 16 during programming or erasing of the voltage recovery switch 10 to prevent neutralizing discharge of the positive and negative voltages. After the programming or erasing of the non-volatile memory, the first and second control signals CTRL1 and CTRL2 are employed to respectively turn on the first and second NMOS transistors 12 and 16, so as to neutralize and therefore discharge the positive and negative voltages by the voltage recovery switch 10.

The first NMOS transistor 12 can be directly control by a logical signal, such as the first control signal CTRL switching between 3V and 0V. However, The second NMOS transistor 16 is electrically connected to a negative voltage having a large absolute value, such as a voltage of 10V, and can only be operated in a cut-off region when a negative voltage $V_N$ is applied on the second NMOS transistor 16 by the second control signal CTRL2. In order to control the second NMOS transistor 16, the second control signal CTRL2 needs to be a control signal switching between the negative voltage $V_N$ and 0V. As a result, the cost for the circuit design of the non-volatile memory is much increased. In addition, as the second NMOS transistor 16 is turned on, the voltage difference between the gate and the source of the second NMOS transistor 16 is 13V, which frequently leads to breakdown of the second NMOS transistor 16.

SUMMARY OF INVENTION

It is therefore a primary object of the present invention to provide a voltage recovery switch so as to prevent device breakdown of transistors in a non-volatile memory.

According to the claimed invention, the voltage recovery switch is employed for neutralizing a first voltage and a second voltage in a non-volatile memory. The voltage recovery switch comprises a first PMOS transistor, an NMOS transistor, and a second PMOS transistor. A gate of the first PMOS transistor is electrically connected to a third voltage, and a source of the first PMOS transistor is electrically connected to the first voltage. A gate of the NMOS transistor is electrically connected to a control signal, and a drain of the NMOS transistor is electrically connected to a drain of the first PMOS transistor. A gate of the second PMOS transistor is electrically connected to a fourth voltage, a source of the second PMOS transistor is electrically connected to a source of the NMOS transistor, and a drain of the second PMOS transistor Is electrically connected to the second voltage.

It is an advantage of the present invention over the prior art that the control signal of the voltage recovery switch employed to control the NMOS transistor is a frequently adapted logical signal. The cost burden for the circuit design of the non-volatile memory as revealed in the prior art is therefore prevented. In addition, the second PMOS transistor is inserted between the NMOS transistor and the second voltage. The voltage difference between the gate and the source of the NMOS transistor is well controlled, preventing breakdown of the NMOS transistor.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
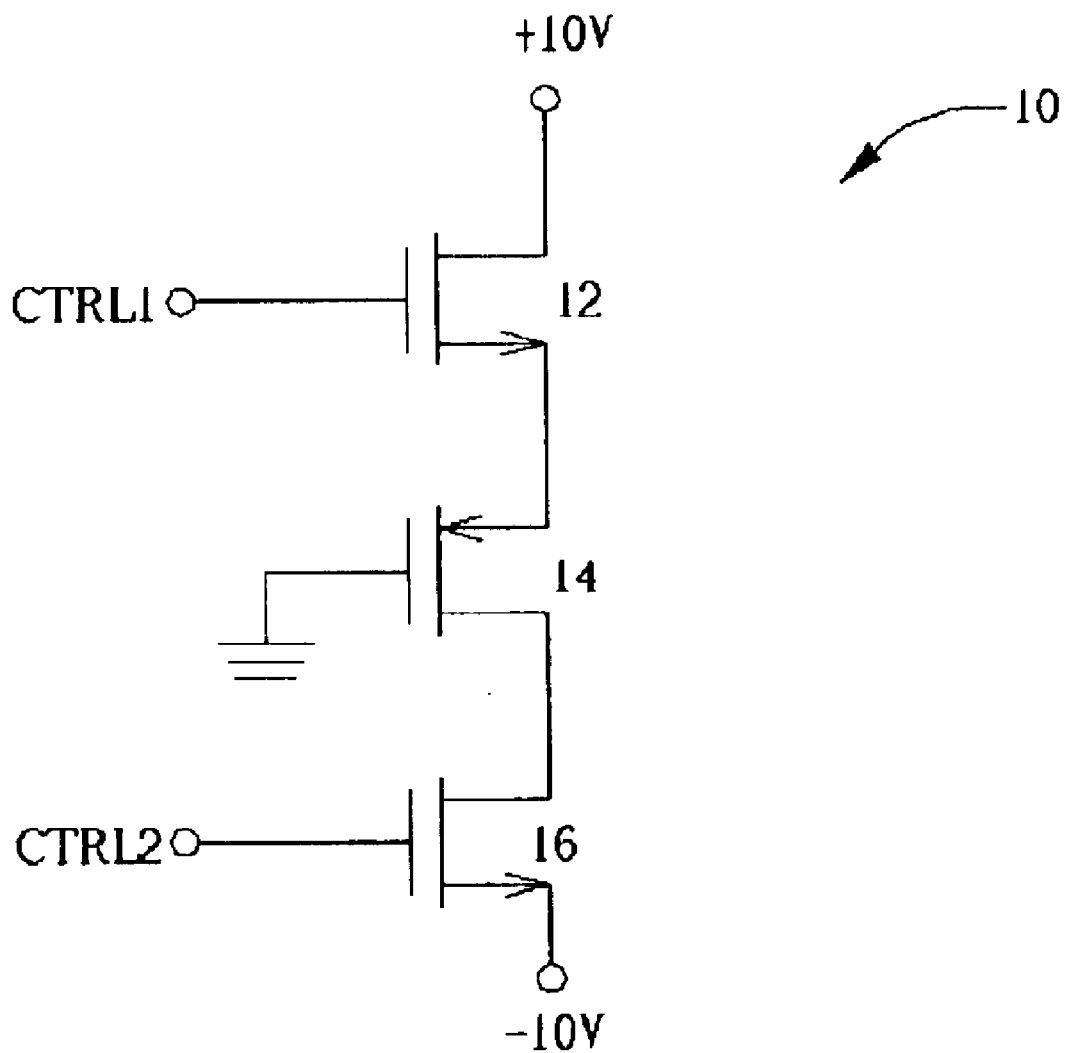
FIG. 1 is a schematic view of a voltage recovery switch according to the prior art.
Figure 2:
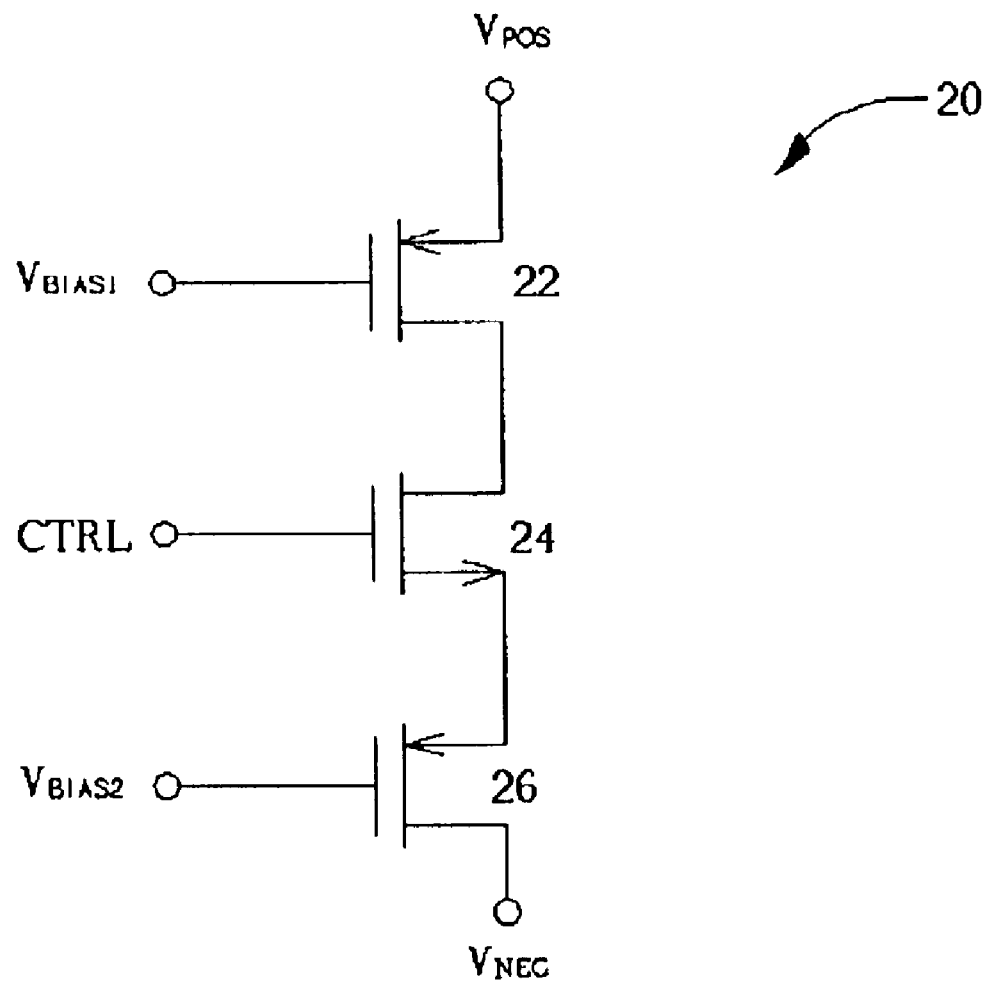
FIG. 2 is the schematic view of a voltage recovery switch according to the present invention.

Please refer to FIG. 2 showing a schematic view of a voltage recovery switch 20 for neutralizing a first voltage $V_{POS}$ and a second voltage $V_{NEG}$ in a non-volatile memory according to the present invention. As shown in FIG. 2, the voltage recovery switch 20 comprises a first PMOS transistor 22, an NMOS transistor 24, and a second PMOS transistor 26. A gate of the first PMOS transistor 22 is electrically connected to a third voltage $B_{BIAS1}$, and a source of the first PMOS 22 is electrically connected to the first voltage $V_{POS}$. A gate of the NMOS transistor 24 is electrically connected to a control signal CTRL, and a drain of the NMOS transistor 24 is electrically connected to a drain of the first PMOS transistor 22. A gate of the second PMOS transistor 26 is electrically connected to a fourth voltage $V_{BIAS2}$, a source of the second PMOS transistor 26 is electrically connected to a source of the NMOS transistor 24, and a drain of the second PMOS transistor 26 is electrically connected to the second voltage $V_{NEG}$.

Generally, the non-volatile memory comprises a charge pump. In the preferred embodiment of the present invention, the first and second voltages $V_{POS}$ and $V_{NEG}$ are generated by the charge pump and are respectively a positive high potential voltage of +10V and a negative high potential voltage of 10V, and the control signal CTRL is a logical signal switching between 3V and 0V. The third voltage $V_{BIAS1}$ and the fourth voltage $V_{BIAS2}$ provide bias with constant voltage values. The third voltage $V_{BIAS1}$ is employed for providing the first PMOS transistor 22 with bias needed for the voltage recovery switch 20 to neutralize the first and second voltages $V_{POS}$ and $V_{NEG}$, and the fourth voltage $V_{BIAS2}$ is a grounded voltage employed for providing the second PMOS transistor 26 with bias for preventing breakdown of the NMOS transistor 24.

Figure 3:
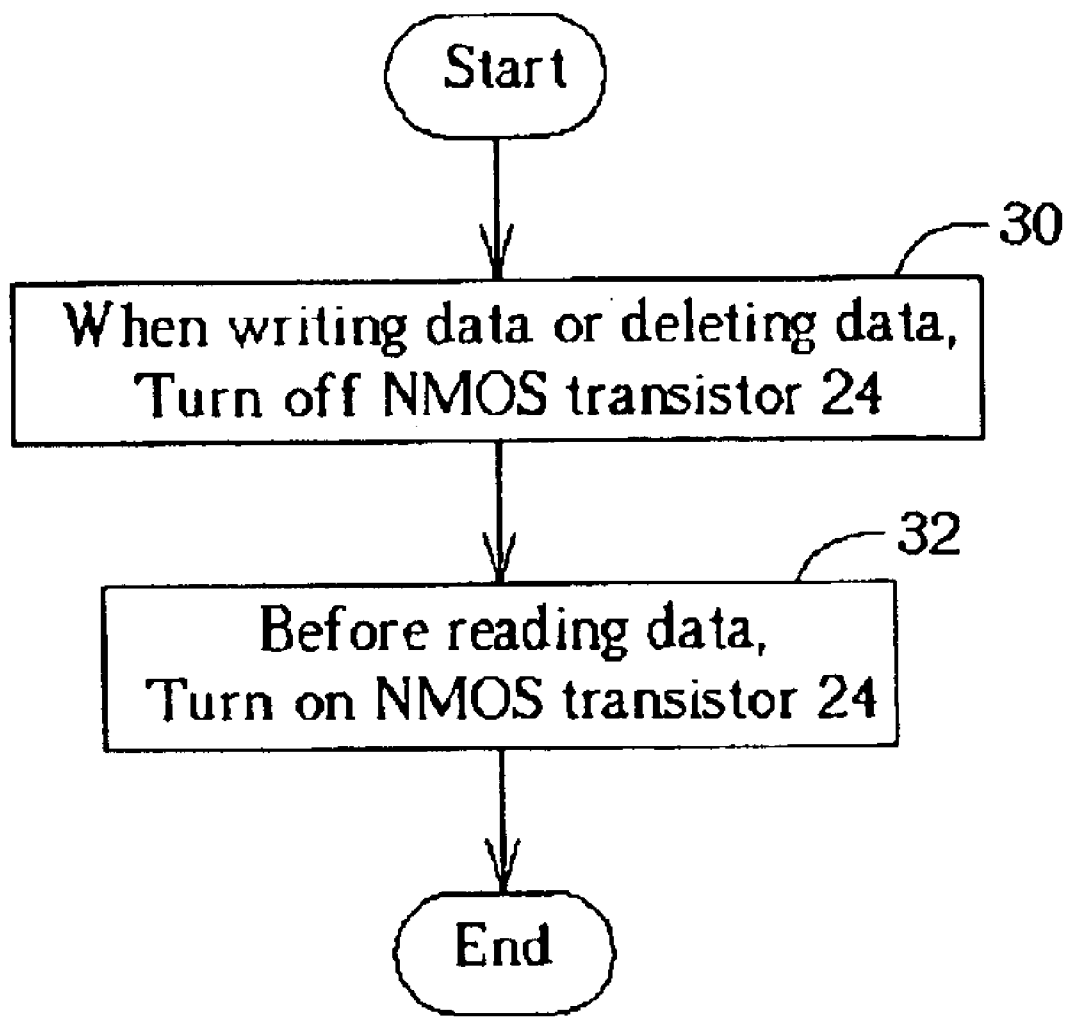
FIG. 3 is a flowchart for the operation of the voltage recovery switch disclosed in FIG.2.

Please refer to FIG. 3 showing a flowchart of the operation of the voltage recovery switch 20 disclosed in FIG. 2 for neutralizing the first and second voltages $V_{POS}$ and $V_{NEG}$. As shown in FIG. 3, a step 30 is performed during the programming or erasing of the non-volatile memory to generate the high potential first and second voltages $V_{POS}$ and $V_{NEG}$ by the charge pump and switch the control signal CTRL to be at a logical "0" level by grounding the control signal CTRL, turning off the NMOS transistor 24, and therefore leading to a turn-off phase of the voltage recovery switch 20.

A step 32 is then performed during the programming of the non-volatile memory to program the non-volatile memory at a voltage level of a power supply voltage, such as 3V, turn off the charge pump, and switch the control signal CTRL to be at a logical "1" level, such as the voltage level of the power supply voltage of 3V. This turns on the NMOS transistor 24 and therefore leads to a turn-on phase of the voltage recovery switch 20. Simultaneously, the first and second voltages $V_{POS}$ and $V_{NEG}$ conduct to each other and therefore start to discharge until the first voltages $V_{POS}$ is at a voltage level equal to a summation of the third voltage $V_{BIAS1}$ and a threshold voltage of the first PMOS transistor 22, and then both the PMOS transistor 22 and the voltage recovery switch 20 are turned off. Then, as described in the prior art, the first and second voltages $V_{POS}$ and $V_{NEG}$ are both electrically connected to the power supply voltage for further discharge until both the first and second voltages $V_{POS}$ and $V_{NEG}$ are at a stand-by voltage level. Since charges in the first and second voltages $V_{POS}$ and $V_{NEG}$ are decreased after the discharge of the first and second voltages $V_{POS}$ and $V_{NEG}$, bounce of the voltage level of the first and second voltages $V_{POS}$ and $V_{NEG}$ is therefore acceptable.

In a second embodiment of the present invention, the first voltage $V_{POS}$, the third voltage $V_{BIAS1}$, and the threshold voltage of the first PMOS transistor 22 are respectively at voltage levels of +10V, 3V and 0.7V. During the neutralization of the first and second voltages $V_{POS}$ and $V_{NEG}$ by the voltage recovery switch 20, absolute values of both the first and second voltages $V_{POS}$ and $V_{NEG}$ decrease as well until the first voltage $V_{POS}$ is at a voltage level of 3.7V. The first PMOS transistor 22 is then shifted into a cut-off region, leading to the turn-off phase of the voltage recovery switch 20 since a potential voltage of the source and the drain of the first PMOS transistor 22 is equal to the threshold voltage of the first PMOS transistor 22. Alternatively, the voltage level of the third voltage $V_{BIAS1}$ can be defined within the range between 0V and that of the first voltage $V_{POS}$ during the neutralization of the first and second voltages $V_{POS}$ and $V_{NEG}$.

In comparison with the prior art, the control signal of the voltage recovery switch 20 employed to control the NMOS transistor 24 is a frequently adapted logical signal. The cost burden for the circuit design of the non-volatile memory as revealed in the prior art is therefore prevented. In addition, the second PMOS transistor 26 is inserted between the NMOS transistor 24 and the second voltage. The voltage difference between the gate and the source of the NMOS transistor 24 is well controlled, preventing breakdown of the NMOS transistor 24.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A voltage recovery switch for neutralizing a first voltage and a second voltage in a non-volatile memory, the voltage recovery switch comprising:
    a first PMOS transistor whereof a gate is electrically connected to a third voltage, and a source is electrically connected to the first voltage;
    an NMOS transistor whereof a gate is electrically connected to a control signal, and a drain is electrically connected to a drain of the first PMOS transistor; and
    a second PMOS transistor whereof a gate is electrically connected to a fourth voltage, a source is electrically connected to a source of the NMOS transistor, and a drain is electrically connected to the second voltage.

2. The voltage recovery switch of claim 1 wherein the first voltage is a positive voltage generated by charge pumping when data is written to or erased from the non-volatile memory.

3. The voltage recovery switch of claim 1 wherein the third voltage is a positive voltage larger than 0V and smaller than the first voltage.

4. The voltage recovery switch of claim 1 wherein the second voltage is a negative voltage generated by charge pumping when data is written to or erased from the non-volatile memory.

5. The voltage recovery switch of claim 1 wherein the fourth voltage is a ground voltage.

6. The voltage recovery switch of claim 1 wherein the non-volatile memory further comprises a power supply voltage; and when the control signal is at a logical "1" level, the control signal has a voltage level of the power supply voltage, when the control signal is at a logical "0" level, the control signal is grounded.

7. The voltage recovery switch of claim 6 wherein when the control signal is at a logical "0" level, the NMOS transistor is turned off, whereby the voltage recovery switch turns off.

8. The voltage recovery switch of claim 6 wherein when the control signal is at a logical "1" level, the NMOS transistor is turned on, whereby the voltage recovery switch turns on.

9. The voltage recovery switch of claim 8 wherein when the voltage recovery switch turns on, both the first voltage and the second voltage discharge by sharing their electrical charges until the first voltage equals the third voltage plus a threshold voltage of the first PMOS transistor, the first PMOS transistor turns off, whereby the voltage recovery switch turns off.

10. A method for neutralizing a first voltage and a second voltage, used in a non-volatile memory, the non-volatile memory having a voltage recovery switch, the voltage recovery switch having:
 a first PMOS transistor whereof a gate is electrically connected to a third voltage, and a source is electrically connected to the first voltage;
 an NMOS transistor whereof a gate is electrically connected to a control signal, and a drain is electrically connected to a drain of the first PMOS transistor; and
 a second PMOS transistor whereof a gate is electrically connected to a fourth voltage, a source is electrically connected to a source of the NMOS transistor, and a drain is electrically connected to the second voltage;
the method comprising:
 turning off the NMOS transistor using the control signal, so as to turn off the voltage recovery switch; and
 turning on the NMOS transistor using the control signal, so as to turn on the voltage recovery switch, whereby both the first voltage and the second voltage discharge by sharing their electrical charges.

11. The method of claim 10 wherein the first voltage is a positive voltage generated by charge pumping when data is written to or erased from the non-volatile memory.

12. The method of claim 10 wherein the third voltage is a positive voltage larger than 0V and smaller than the first voltage.

13. The method of claim 10 wherein the second voltage is a negative voltage generated by charge pumping when data is written to or erased from the non-volatile memory.

14. The method of claim 10 wherein the fourth voltage is a ground voltage.

15. The method of claim 10 wherein the non-volatile memory further comprises a power supply voltage; and when the control signal is at a logical "1" level, the control signal has a voltage level of the power supply voltage, when the control signal is at a logical "0" level, the control signal is grounded.

16. The method of claim 15 wherein when the control signal is at a logical "0" level, the NMOS transistor Is turned off, whereby the voltage recovery switch turns off.

17. The method of claim 15 wherein when the control signal is at a logical "1" level, the NMOS transistor is turned on, whereby the voltage recovery switch turns on.

18. The method of claim 10 wherein when the voltage recovery switch turns on, both the first voltage and the second voltage discharge by sharing their electrical charges until the first voltage equals the third voltage plus a threshold voltage of the first PMOS transistor, the first PMOS transistor turns off, whereby the voltage recovery switch turns off.

* * * * *